United States Patent [19]
Hamuro et al.

[11] Patent Number: 5,806,715
[45] Date of Patent: Sep. 15, 1998

[54] CHIP ALIGNMENT/FEED APPARATUS

[75] Inventors: Mitsuro Hamuro, Otsu; Keiichi Shimamaki, Shiga-ken; Kenji Ijichi, Mishima-gun, all of Japan

[73] Assignee: Murata Manufacturing Co., Ltd., Japan

[21] Appl. No.: 589,948

[22] Filed: Jan. 23, 1996

[30] Foreign Application Priority Data

Jan. 23, 1995 [JP] Japan ................................ 7-027429

[51] Int. Cl.⁶ .................................................. B23Q 7/00
[52] U.S. Cl. .............................................. 221/174; 141/18
[58] Field of Search .................................. 221/197, 174, 221/282, 287; 141/18, 173, 154

[56] References Cited

U.S. PATENT DOCUMENTS

| | | | |
|---|---|---|---|
| 594,127 | 11/1897 | Walsh | 141/18 |
| 1,162,133 | 11/1915 | Larmody | 141/18 |
| 4,801,044 | 1/1989 | Kubota et al. | 221/163 |
| 4,953,749 | 9/1990 | Kubota et al. | 221/168 |
| 5,070,988 | 12/1991 | Konishi et al. | 198/380 |

FOREIGN PATENT DOCUMENTS

688159  6/1995  European Pat. Off. .

*Primary Examiner*—Kenneth Noland
*Attorney, Agent, or Firm*—Ostrolenk, Faber, Gerb & Soffen, LLP

[57] ABSTRACT

A bulk cassette has a container chamber at its rear end, and an outlet port at its front end. A plurality of chips within the container chamber are discharged from the outlet port one by one in an aligned fashion. A chip case is detachably connected to the rear end of the bulk cassette and includes an internal container space within which a plurality of chips can be contained. The chip case has a supply opening at its front end so as to feed the chips from the container space to the container chamber of the bulk cassette. The chip case also has a receiving opening at its rear end so as to feed additional chips into the container space. A closure member is mounted to the rear end of the chip case to open and close the receiving opening. A pipe is inserted into the receiving opening for replenishment of chips.

10 Claims, 8 Drawing Sheets

CHIP ALIGNMENT/FEED APPARATUS

BACKGROUND OF THE INVENTION

1. Field of the Invention

The present invention relates to an alignment/feed mechanism for aligning a plurality of randomly supplied chips and feeding them one by one.

2. Description of the Related Art

Heretofore, a chip mounting machine has been employed to automatically mount chips onto a printed circuit board. In order to linearly align a plurality of randomly supplied chips and feed them one by one, the chip mounting machine requires an alignment/feed mechanism, better known as a bulk feeder.

To this end, there is proposed an automatic chip alignment/feed apparatus with a cartridge-type chip case, as disclosed by Japanese laid-open patent publication No. Sho 63-127600.

The chip case can be used as a container during shipping of chips. This chip case may also be directly mounted on a chip mounting machine.

A typical chip case can contain a large number of chips, for example 5,000 to 100,000 chips, although this number may vary depending on the type of chips used. However, such a large number of chips tends to be used up in a relatively short period of time since a chip mounting machine is operated at high speeds. Thus, there is a need to monitor the number of chips used, to remove an empty chip case from the body of an alignment/feed mechanism, and to replace it with a new chip case. The chip mounting machine stops for four to six seconds during loading of a printed circuit board. But it is impossible to replace the empty chip case within such a short period of time. This lowers the operating efficiency of the machine. Replacement of chip cases requires an operator to be located near the chip mounting machine. It is thus difficult to automate the replenishment operation.

As the size of the chip case increases, the frequency with which the chip case must be replaced decreases. However, there is a limitation on the practical size of the chip case. This is because the alignment/feed apparatus constitutes part of the chip mounting machine and are arranged in parallel in the thickness direction so as to simultaneously feed different types of chips. Moreover, the alignment/feed apparatus must be reciprocated at high speeds in response to movement of the chip mounting machine. It is therefore necessary to avoid an increase in the weight of alignment/feed apparatus. Additionally, the chip case should be thin and relatively small.

Accordingly, it is an object of the present invention to provide an alignment/feed apparatus which can readily replenish a container with chips when the number of chips within the container is reduced below a predetermined level.

SUMMARY OF THE INVENTION

According to one aspect of the present invention, there is provided an alignment/feed apparatus comprising a bulk feeder having a container chamber at its rear end and an outlet port through which chips within the container chamber are fed one by one in an aligned fashion, and a chip case detachably connected to the rear end of the bulk feeder, the chip case having at its front end a supply port through which the chips are fed from the chip case into the container chamber of the bulk feeder, wherein the chip case has at its rear end a receiving opening through which the chips are fed into the chip case.

According to another aspect of the present invention, there is provided an alignment/feed apparatus comprising a container chamber within which a plurality of chips are contained, and an outlet port through which the chips within the container chamber are discharged one by one in an aligned fashion, wherein the container chamber has at its rear end a receiving opening for replenishment of additional chips.

In a preferred embodiment, a closure member and a return spring are mounted to the receiving opening. The return spring is adapted to urge the closure member into a closed position. Alternatively, the receiving opening is closed by a resilient sheet. The resilient sheet includes a central slit.

When the number of chips within the container chamber of the bulk cassette falls below a predetermined level, additional chips are fed through the receiving opening. This arrangement permits ready replenishment of chips without the need to remove the chip case.

Where the closure member is mounted to open and close the receiving opening, or the resilient sheet with the slit is attached so as to close the receiving opening, no chip within the container chamber will drop from the receiving opening if the alignment/feed apparatus is operated strenuously after additional chips have been fed.

Replenishment of chips may be effected manually by an operator or automatically by another automatic replenishing apparatus.

BRIEF DESCRIPTION OF THE DRAWINGS

For the purpose of illustrating the invention, there is shown in the drawing several forms which are presently preferred, it being understood, however, that the invention is not limited to the precise arrangements and instrumentalities shown.

DESCRIPTION OF THE PREFERRED EMBODIMENTS

Figure 1:
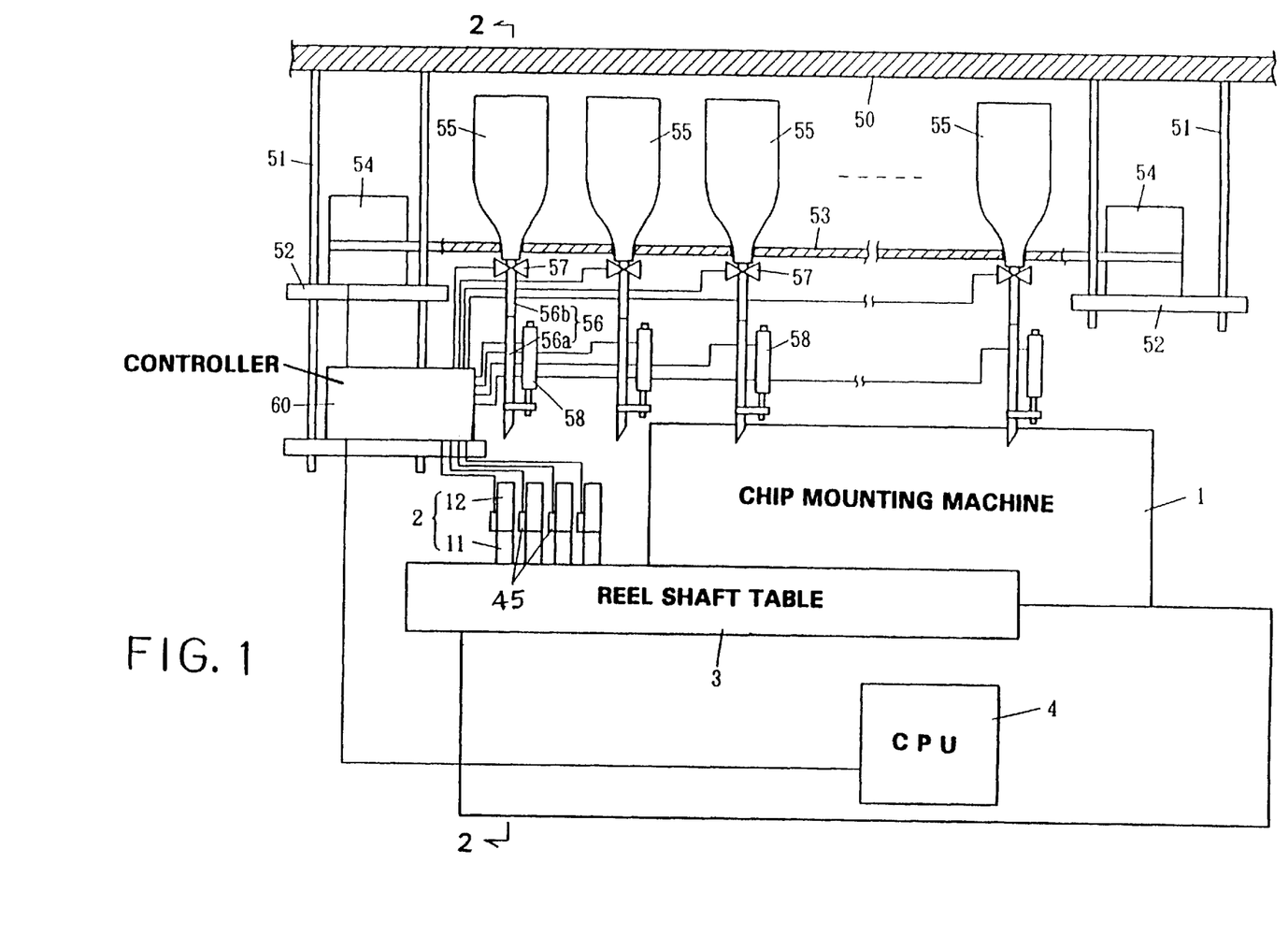
FIG. 1 is an overall view of a chip mounting machine with an automatic replenishing apparatus.
Figure 2:
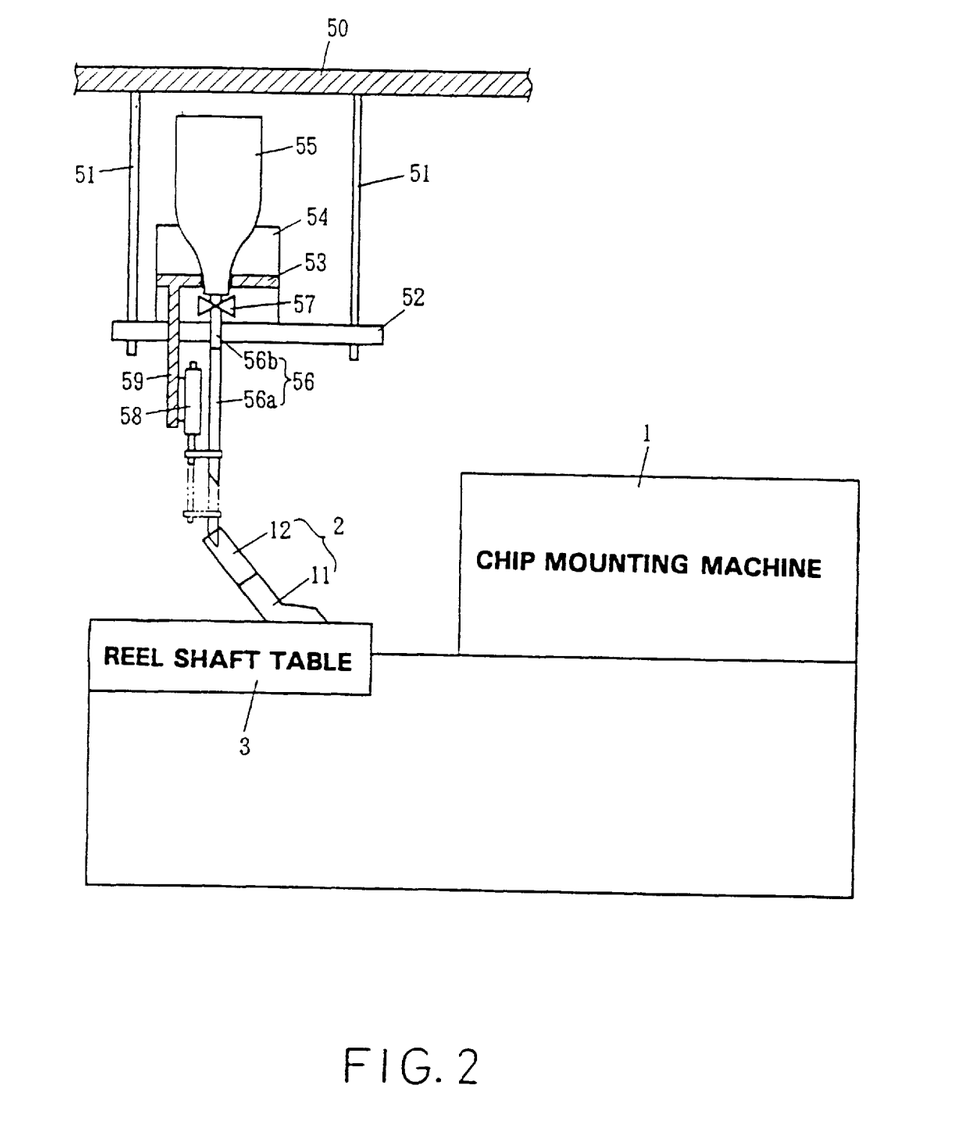
FIG. 2 is a sectional view taken on the line A—A in FIG. 1.

Referring now to the drawings wherein like numerals indicate like elements, there is shown in FIGS. 1 and 2 an embodiment of the present invention which is applied to a chip mounting machine. The invention includes a one-by-one type chip mounting machine 1, a bulk feeder 2 serving as an alignment/feed apparatus, and a reel shaft table 3 which is horizontally movable relative to the chip mounting machine 1. A plurality of bulk feeders 2 are placed on the upper surface of the reel shaft table 3 (e.g., an X-Y table) and arranged in parallel in the thickness direction of the reel shaft table 3.

In FIG. 1, four bulk feeders 2 are mounted to the chip mounting machine 1. However, the number of the bulk feeders 2 may vary depending on the types of chips used.

Figure 3:
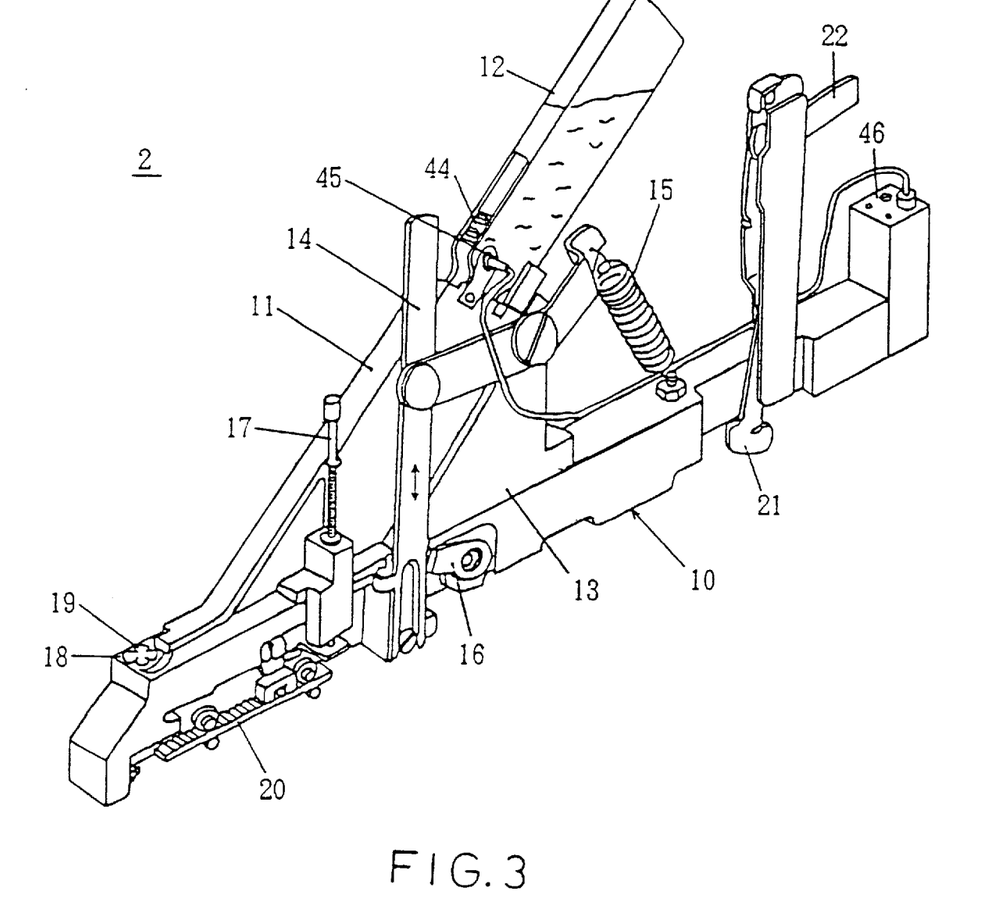
FIG. 3 is a perspective view of a bulk feeder.

Reference will first be made to the bulk feeders 2. Each of the bulk feeders 2 includes various components which, except for a chip case 12, a chip presence sensor 45, and a sensor sensitivity adjuster 46 (described below), are well known.

As shown in FIG. 3, the bulk feeder 2 includes a body 10, a bulk cassette 11 detachably mounted to the body 10, and a chip case 12 detachably connected to the bulk cassette 11. The body 10 is associated with a triangular base 13 for supporting the bulk cassette 11 obliquely at an angle of approximately 45°, a vertically movable feed lever 14, a return spring 15 for urging the feed lever 14 in an upward direction, a mechanical valve 16 for selectively feeding air under pressure, an index pin push lever 17, an index table 18, an index wheel 19, and a rack-and-pinion mechanism 20.

When the feed lever 14 is pressed down, the mechanical valve 16 is opened to feed air under pressure into the valve cassette 11. At this time, the rack-and-pinion mechanism 20 is operated to rotate the index wheel 19 by a fixed angle (for example, approximately 90°). The index wheel 19 has a plurality of recesses arranged in a circumferentially 90° spaced relationship and adapted to receive chips one at a time. A chip, after being discharged from the outlet port of the bulk cassette 11, is fit into one of the recesses of the index wheel 19. The chip is then rotated by a predetermined angle and stopped at a predetermined position on the index table 18. The index pin push lever 17 is also lowered when the feed lever 14 is pressed down. The index pin push lever 17 is associated with a suitable mechanism (not shown) so as to allow a pin (not shown) to push the chip upwardly from the index table 18 during downward movement of the index pin push lever 17. The chip is then gripped by the chip mounting machine 1 and removed from the bulk feeder 2.

A clamp pawl 21 and a clamp lever 22 are attached to the rear end of the body 10. The body 10 is secured to the reel shaft table 3 by the clamp pawl 21 which in turn, is operated by the clamp lever 22.

Figure 4:
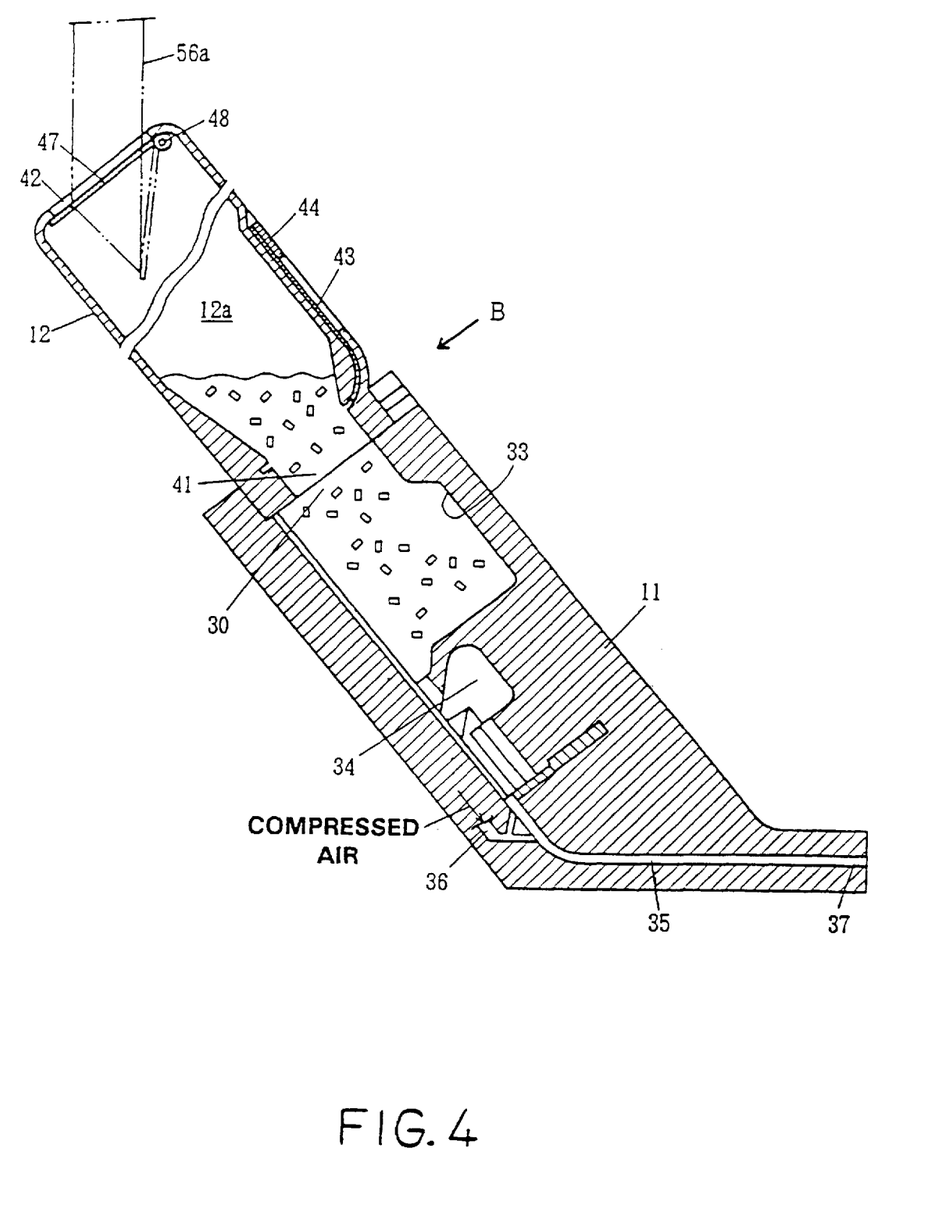
FIG. 4 is a sectional view of a bulk cassette and a chip case.
Figure 5:
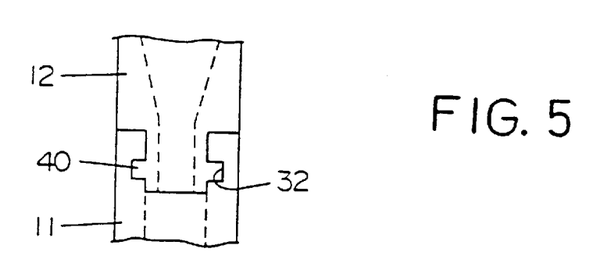
FIG. 5 is a partial view of the bulk cassette and the chip case as seen in the direction of the arrow B in FIG. 4.

As shown in FIG. 4, the bulk cassette 11 has an inlet port 30 at its rear end. The chip case 12 is detachably mounted to the inlet port 30. In the embodiment shown in FIG. 5, the bulk cassette 11 has a pair of grooves 32. The chip case 12 has a corresponding pair of projections 40 which are slidably fit within the grooves 32 so as to securely mount the chip case 12 to the bulk cassette 11. At this time, the inlet port 30 of the bulk cassette 11 corresponds to and is communicated with an opening 41 of the chip case 12.

A number of chips are transferred from the chip case 12 to the bulk cassette 11. The chips are first introduced into a large chamber 33, then enter a small chamber 34, and finally move into an alignment passage 35. Two compressed air openings 36 are defined adjacent to the inlet end of the alignment passage 35. The compressed air openings 36 are connected to the mechanical valve 16. A compressed air is injected from these openings 36 when the mechanical valve 16 is opened. The chips within the small chamber 34 are then urged into the alignment passage 35 one by one. Those chips which have previously been introduced into the alignment passage 35 are then pushed in a forward direction. An outlet port 37 is defined in the bulk cassette 11 adjacent to the front end of the alignment passage 35. The chips are discharged from the outlet port 37 one by one. The internal structure of the bulk cassette 11 is similar to that disclosed in Japanese laid-open patent publication No. Hei 3-187298 and will not be described herein.

The chip case 12 is preferably transparent and made of resin. The chip case 12 has an internal container space 12*a* large enough to house a large number of chips, for example, 5,000 to 100,000 chips. The chip case 12 has a supply opening 41 and a receiving opening 42 at its front and rear ends, respectively. The front or supply opening 41 is closable by a slidable elongated plate 43. The elongated plate 43 is in the form of a flexible thin plate and has a manually operable knob 44 at its rear end. With the chip case 12 mounted to the bulk cassette 11, the elongated plate 43 is moved to open the opening 41 so as to feed chips from the chip case 12 into the bulk cassette 11. A chip presence sensor 45 (see FIG. 3) is attached to the chip case 12 adjacent to the supply opening 41. This sensor 45 is designed to detect whether the number of chips within the chip case 12 is reduced below a predetermined level. The sensor 45 is preferably of the reflection type, but may be of the transmission type or any other types (for example, contact sensor or mechanical switch). A sensor sensitivity adjuster 46 is mounted to the rear end of the bulk feeder body 10. The sensor 45 is connected to a controller 60 through the sensor sensitivity adjuster 46.

Figure 6:
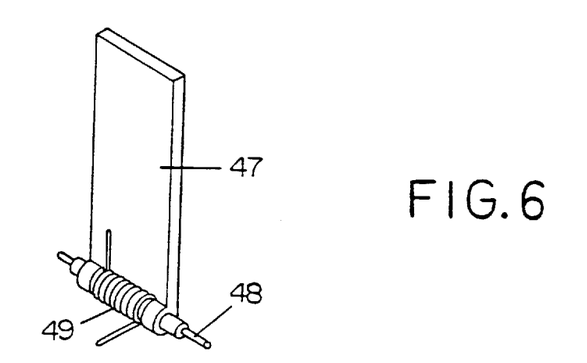
FIG. 6 is a perspective view of a closure member.

A closure plate 47 is mounted to the rear end of the chip case 12 and moved inwardly to open the rear or receiving opening 42. As shown in FIG. 6, the closure plate 47 is rotated about a horizontal pin 48 and is urged under the action of a coil spring 49 so as to normally close the receiving opening 42. When the lower end of a replenishment piping 56 is inserted into the receiving opening 42, the closure member 47 is rotated inwardly from the receiving opening 42. This allows the piping 56 to readily rotate or open the closure member and also, prevents the closure member from being opened as chips within the container space 12*a* push the closure member.

Reference will next be made to an apparatus for automatically replenishing the chip case 12 with additional chips.

As shown in FIG. 1, a top plate 50 is mounted above the reel shaft table 3. A plurality of hanger posts 51 depend from the top plate 50. A plurality of shelves 52 are secured to the hanger posts 51. A single shaft drive mechanism 54 is mounted on one of the shelves 52 so as to drive or move a support table 53 in a horizontal direction. This drive mechanism 54 is operated under the control of the controller 60. A plurality of chip tanks 55 are supported, in an inverted fashion, by the support table 53. The chip tanks 55 contain different types of chips, each tank containing, for example, on the order of 1,000,000 chips. Four tanks 55 are shown in FIG. 1, but any number of tanks may be used. The replenishment piping 56 is releasably connected to the open bottom of each of the chip tanks 55. A respective on-off valve 57 is disposed between each piping 56 and its associated chip tank 55 and is operated under the control of the controller 60.

In the illustrated embodiment, the replenishing piping 56 is composed of two pipes 56*a*, 56*b* which are slidable relative to each other. The lower pipe 56*a* is vertically moved by an air cylinder 58. The air cylinder 58 is mounted to a vertical wall 59 (see FIG. 2) which in turn, is fixed to the lower surface of the support table 53. The air cylinder 58 is also operated under the control of the controller 60. When the air cylinder 58 is actuated, the pipe 56a is moved downwards. The lower end of the pipe 56a is then inserted into the chip case 12. The lower end of the pipe 56a is sharply pointed. This facilitates insertion of the pipe 56a into the chip case 12. The piping 56 preferably has a circular section, but may have a rectangular section or any other shape as long as chips can smoothly be moved through the piping.

The controller 60 is operatively associated with the chip mounting machine 1 and controls the drive mechanism 54, the on-off valve 57 and the air cylinder 58. The drive mechanism, 54, the on-off valve 57, and the air cylinder 58 collectively constitute the automatic replenishing apparatus. The controller 60 is also connected to a central processing unit (CPU) 4 so that the controller 60 and the chip mounting machine 1 are operatively associated with one another. The CPU 4 not only controls the chip mounting machine 1, but also drives the reel shaft table 3 in synchronism with movement of the chip mounting machine 1. The controller 60 also sends instructional signals so as to actuate the feed lever 14 and the index pin push lever 17. Operation of the automatic replenishing apparatus thus constructed will now be described with reference to FIG. 7.

When a printed circuit board is introduced or loaded onto the chip mounting machine 1, the chip mounting machine 1 is operable to mount chips, which are fed from the bulk feeder 2, to the printed circuit board one by one. When all of the chips have been mounted to the printed circuit board, the printed circuit board is transferred to the next station. Another printed circuit board is then loaded onto the chip mounting machine 1. During loading of a new printed circuit board, the chip mounting machine must be temporarily stopped for about four to six seconds.

Figure 7:
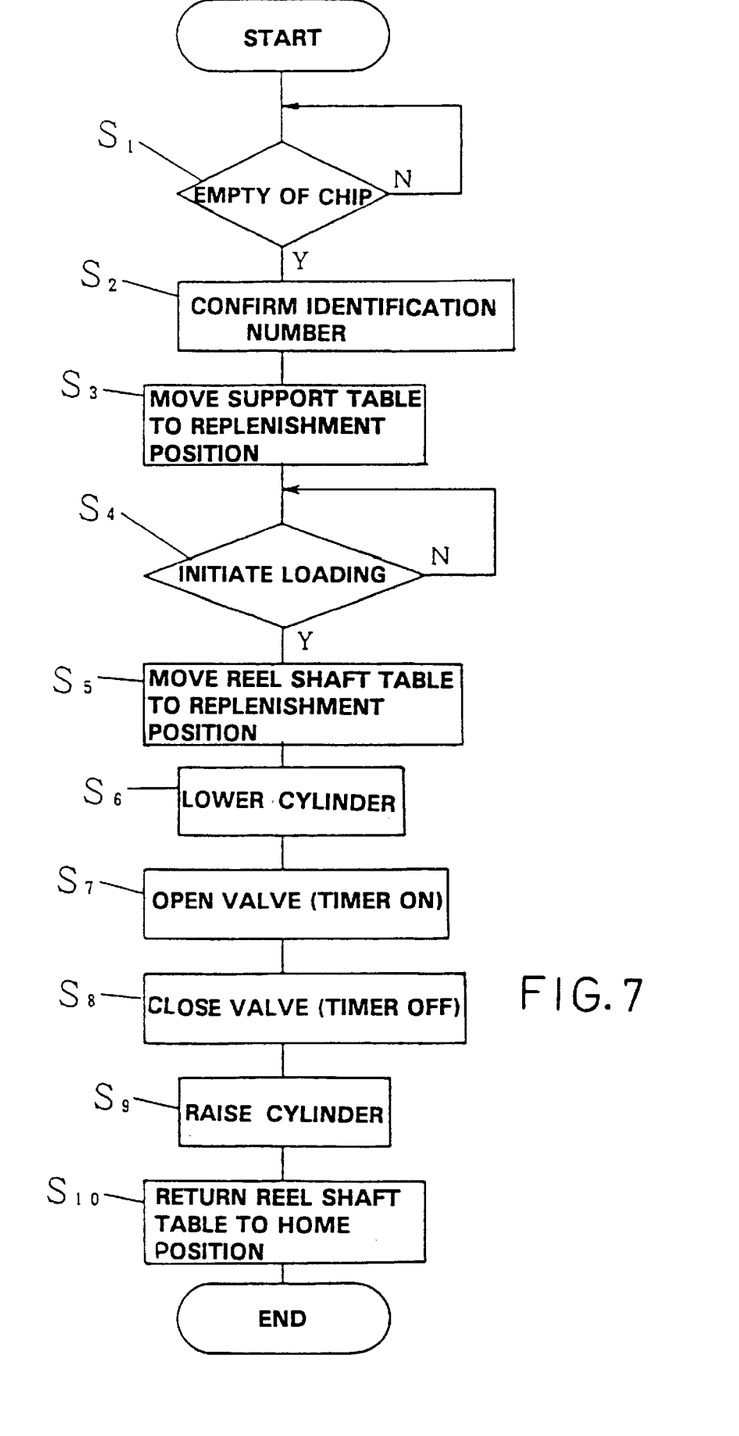
FIG. 7 is a flow chart showing operation of the automatic replenishing apparatus.

While the chips are being mounted, the chip presence sensor 45 detects whether the number of the chips within the chip case 12 is reduced below a predetermined level (step S1). The chip presence sensor 45 sends a corresponding signal to the controller 60. The controller 60 will then take all the necessary steps to replenish the chip case with additional chips. Initially, the CPU 4 confirms the identification number of the empty chip case 12 (step S2). The support table 53 is then moved to locate the chip tank 55 with the same identification number as the empty chip case 12 above the bulk feeder 2 at a replenishment position (step S3).

While loading of the next printed circuit board takes place (step S4), the CPU 4 is operable to move the reel shaft table 3 to the replenishment position (step S5) so as to locate the bulk feeder 2 with the empty chip case 12 directly below the chip tank 55 with the same identification number as the empty chip case 12. Referring to FIG. 1, the leftmost bulk feeder 2 is vertically aligned with the leftmost chip tank 55. Next, the controller 60 lowers the air cylinder 58 (step S6). The lower end of the replenishment pipe 56a is inserted into the receiving opening 42 of the chip case 12. Substantially at the same time, the controller 60 is operable to open the on-off valve 57 (step S7). As a result, the chips drop from the chip tank 55 under the force of gravity, pass through the piping 56, and then enter the chip case 12. When a predetermined period of time has passed after the on-off valve 57 is opened, the controller 60 closes the on-off valve 57 (step S8). The on-off valve 57 is kept opened until the chip case 12 is substantially filled with, but before it is overfilled with, the chips. When the chip case 12 has been replenished with the chips, the controller 60 is operable to raise the air cylinder 58 (step S9). The pipe 56a is removed from the chip case 12. When the air cylinder 58 is moved up, the CPU 4 returns the reel shaft table 3 to its home position (step S10).

While replenishment of the chips is being carried out, the printed circuit board is simultaneously loaded onto the chip mounting machine. Loading of the printed circuit board is completed substantially at the same time as replenishment of the chips is completed. After the printed circuit board has been loaded, the chip mounting machine 1 is operable to again initiate mounting of the chips in a usual manner.

As thus far described, replenishment of chips is carried out while a printed circuit board is being loaded. Accordingly, there is no need to stop operation of the chip mounting machine 1 for each replenishing operation. The chip mounting machine 1 is thus capable of continuous operation.

In this embodiment, replenishment of chips is carried out during loading of a printed circuit board. However, the invention is not limited thereto. Alternatively, the chip tank 55 is moved in synchronism with the bulk feeder 2 during mounting so as to replenish each empty chip case 12 with additional chips.

Also, the support table 53 is moved in such a direction as to bring the chip tank 55 into vertical alignment with the empty bulk feeder 2. Alternatively, the reel shaft table 3 may be moved to a desired position to move the empty bulk feeder 2 while the position of the support table 53 with the chip tanks 55 is fixed or both the table 3 and the table 53 may be moved.

In the automatic replenishing apparatus, the pipe is subject to vertical expansion and contraction. The cylinder is operable to vertically move the lower end of the pipe and insert the lower end of the pipe into the receiving opening of the chip case. However, the invention is not limited to this arrangement.

Figure 8:
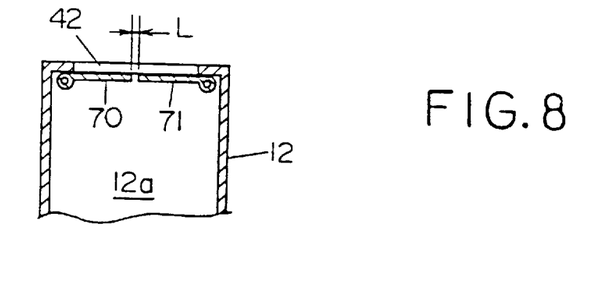
FIG. 8 is a partial sectional view of the chip case with a modified closure member.

FIG. 8 shows a modified closure member.

In this embodiment, the receiving opening 42 of the chip case 12 is opened by a pair of inwardly rotatable closure members 70, 71. These closure members 70, 71 are urged into a closed position under the action of a spring, not shown. The space L between the closure members 70, 71 is small enough to ensure that even the smallest chip can not pass through it.

The closure members 70, 71 of this embodiment are shorter than the closure member of the first embodiment. Accordingly, the front ends of the closure members 70, 71 are less likely to contact the chips when the container space 12a is substantially filled with the chips.

Figure 9:
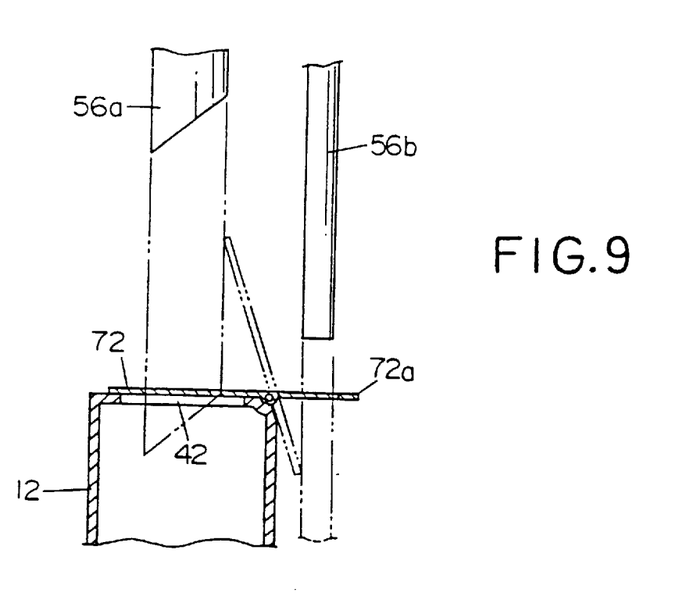
FIG. 9 is a partial sectional view of the chip case with another modified closure member.

FIG. 9 shows another modified closure member.

In this embodiment, a closure member is rotated outwardly from the receiving opening 42. The closure member 72 is urged into a closed position under the action of a spring, not shown. The closure member 72 has a press portion 72a. To open the closure member 72, a push pin 56b is vertically moved with the replenishment pipe 56a so as to push the press portion 72a. The pipe 56a is then inserted through the receiving opening 42.

Figure 10A:
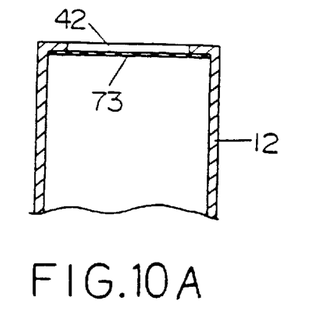
FIG. 10 is a partial sectional view of a modified chip case.
Figure 10B:
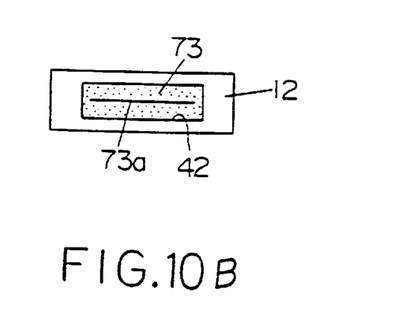

FIG. 10 shows a modified chip case.

In this embodiment, a resilient sheet 73 is made of rubber or the like and attached to the receiving opening 42 of the chip case 12. This sheet 73 has a central vertical slit 73a. When the replenishment pipe is inserted into the receiving opening 42, the slit 73a is opened to allow for ready insertion of the pipe. When the pipe is removed, the slit 73a of the resilient sheet 73 is automatically closed.

Figure 11:
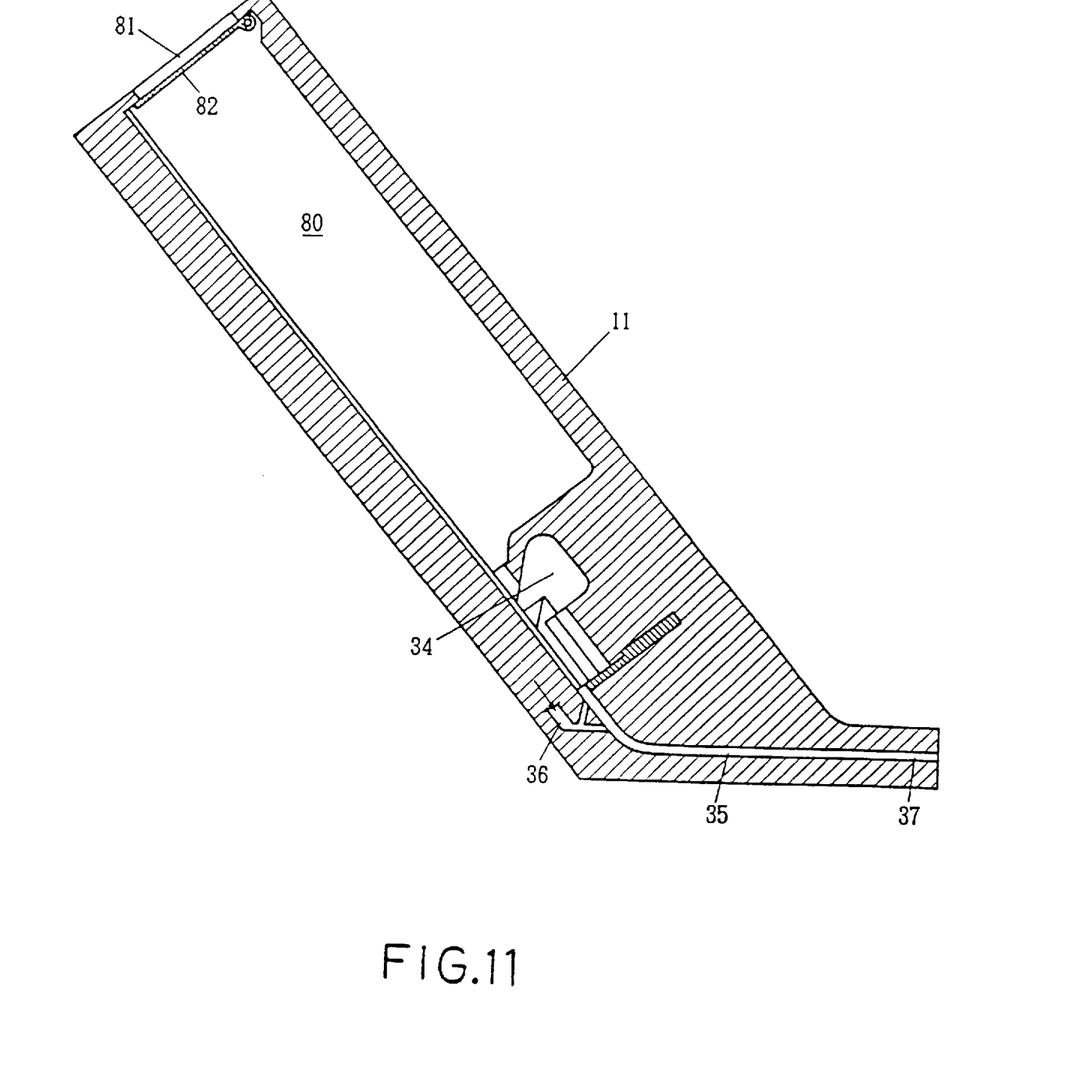
FIG. 11 is a sectional view of an alignment/feed mechanism according to a second embodiment of the present invention.

FIG. 11 shows an alignment/feed apparatus according to a second embodiment of the present invention. Like parts are given like reference numerals used in FIG. 4 and will not be described herein.

This embodiment eliminates the need for a chip case. To this end, the bulk cassette 11 has a large container chamber 80 at its rear to contain a large number of chips, for example, 5,000 to 100,000 chips. A receiving opening 81 is defined in the rear end of the container chamber 80. A closure member 82 is mounted to the receiving opening 81 and rotated inwardly from the receiving opening 81. The closure member 82 is urged into a closed position under the action of a spring, not shown.

In lieu of the closure member 82, there may be provided a pair of closure members as shown in FIG. 8, an outwardly rotatable closure member as shown in FIG. 9, or a resilient sheet as shown in FIG. 10.

Advantageously, a transparent container chamber or space may be provided to allow for visual inspection from outside of the apparatus to confirm whether the number of chips is reduced below a predetermined level. In this way, an operator can manually replenish the chip case with additional chips. However, it would be difficult to manually feed additional chips during mounting of chips or loading of a printed circuit board. Replenishment should be carried out during replacement of the chip cases. In such a case, two bulk feeders may be mounted to the chip mounting machine. One of the two bulk feeders may be operated, whereas the other bulk feeder may be held in a stand-by position. The bulk feeder in the stand-by position may be replenished with chips by manual means. This arrangement allows for ready replacement since a sufficient time is made available to the operator.

It will be appreciated that the present invention is applicable to machines (for example, automatic taping machine) other than a chip mounting machine.

As thus far described, according to the present invention, the container of the alignment/feed apparatus is provided with a receiving opening for replenishment of chips. This allows for ready replenishment of chips without removing the chip case when the container is short of chips. Also, this eliminates the need to stop operation of the machine during replenishment of chips and thus, improves operating efficiency of the machine.

Replenishment can be automated by using a replenishment device having a replenishment pipe at its front end. This improves productivity.

The present invention has been described with respect to its preferred embodiments. It will be understood that various modifications and changes may be made without departing from the spirit and scope of the invention as defined by the appended claims.

What is claimed is:

1. An alignment/feed apparatus comprising:
a bulk feeder having an outlet port through which chips are fed one by one in an aligned fashion; and a chip case detachably connected to said bulk feeder and including an internal container space for storing a plurality of chips, said chip case having a supply port through which said chips are fed from said container space into said bulk feeder and a receiving opening through which said chips are fed into said container space, said chip case including a normally closed closure member comprising a pivotable plate mounted on said chip case and moveable between an open position wherein said receiving opening is open and a closed position wherein said receiving opening is closed.

2. An alignment/feed apparatus according to claim 1, wherein said closure member includes a spring for biasing said plate into said closed position.

3. An alignment/feed apparatus according to claim 2, wherein said plate has an actuating member extending outside of said chip case which can be actuated externally of said chip case to cause said plate to move into said open position.

4. An alignment/feed apparatus according to claim 1, wherein said bulk feeder has a container chamber at its rear end and said chip case communicates with said container chamber.

5. An alignment/feed apparatus according to claim 1, wherein said chip case is designed to hold more chips than said container chamber.

6. An alignment/feed apparatus according to claim 1, wherein said chip case is detachable connected to the rear end of said bulk feeder.

7. An alignment/feed apparatus according to claim 1, wherein said receiving opening is located in the rear end of said chip case, remote from said bulk feeder.

8. An alignment/feed apparatus according to claim 1, wherein a resilient sheet having a central slit formed therein covers and normally closes said receiving opening.

9. An alignment/feed apparatus comprising:
a bulk feed having a container chamber within which a plurality of chips are stored, and an outlet port through which said chips are discharged one by one in an aligned fashion;
said container chamber having a receiving opening through which additional chips may be passed to replenish said container chamber; and
a normally closed closure member moveable between an open position wherein said receiving opening is open and a closed position wherein said receiving opening is closed, said closure member comprising a pivotable plate moveable between said open and closed positions and a spring biasing said plate into said closed position.

10. An alignment/feed apparatus according to claim 9, wherein said receiving opening is covered by a resilient sheet having a central slit formed therein.

* * * * *